United States Patent
Hsiang et al.

(10) Patent No.: US 12,010,771 B2
(45) Date of Patent: Jun. 11, 2024

(54) DETECTION DEVICE AND DETECTION METHOD FOR LIGHT EMITTING ELEMENT

(71) Applicant: Acer Incorporated, New Taipei (TW)

(72) Inventors: Jui-Chieh Hsiang, New Taipei (TW); Chih-Chiang Chen, New Taipei (TW)

(73) Assignee: Acer Incorporated, New Taipei (TW)

( * ) Notice: Subject to any disclaimer, the term of this patent is extended or adjusted under 35 U.S.C. 154(b) by 6 days.

(21) Appl. No.: 17/964,046

(22) Filed: Oct. 12, 2022

(65) Prior Publication Data
US 2023/0209669 A1   Jun. 29, 2023

(30) Foreign Application Priority Data
Dec. 29, 2021 (TW) ................. 110149371

(51) Int. Cl.
*H05B 45/12* (2020.01)
*H10N 30/20* (2023.01)

(52) U.S. Cl.
CPC ............. *H05B 45/12* (2020.01); *H10N 30/20* (2023.02)

(58) Field of Classification Search
CPC ...... H05B 45/12; H05B 47/105; H10N 30/20; H10N 30/30; H10N 39/00; G09G 2330/10; G09G 3/006; G09G 3/20
See application file for complete search history.

(56) References Cited

U.S. PATENT DOCUMENTS

| 9,789,381 | B1 | 10/2017 | Meetin |
| 2018/0174931 | A1 | 6/2018 | Henley |

FOREIGN PATENT DOCUMENTS

| CN | 205608098 | | 9/2016 | |
| CN | 205812442 | | 12/2016 | |
| CN | 109494165 | | 3/2019 | |
| CN | 112750714 | | 5/2021 | |
| JP | 2021153134 | A * | 9/2021 | |
| TW | 201930904 | | 8/2019 | |
| TW | I717670 | | 2/2021 | |
| WO | WO-2018011697 | A1 * | 1/2018 | ........... A61B 5/0006 |
| WO | WO-2021251809 | A1 * | 12/2021 | |

* cited by examiner

*Primary Examiner* — Abdullah A Riyami
*Assistant Examiner* — Syed M Kaiser
(74) *Attorney, Agent, or Firm* — JCIPRNET (57) ABSTRACT

A detection device and a detection method for a light emitting element are provided. The detection device includes a piezoelectricity sensor and a light sensing circuit. The piezoelectricity sensor includes a first piezoelectricity element, wherein the first piezoelectricity element is used to contact a first electrode of the light emitting element to cause a first deformation of the first piezoelectricity element. The first piezoelectricity element generates a first voltage based on the first deformation to power the first electrode. A second electrode of the light emitting element is coupled to a reference voltage. The light sensing circuit is used to sense whether the light emitting element powered by the first voltage emits light.

13 Claims, 7 Drawing Sheets

DETECTION DEVICE AND DETECTION METHOD FOR LIGHT EMITTING ELEMENT

CROSS-REFERENCE TO RELATED APPLICATION

This application claims the priority benefit of Taiwan application serial no. 110149371, filed on Dec. 29, 2021. The entirety of the above-mentioned patent application is hereby incorporated by reference herein and made a part of this specification.

BACKGROUND

Technical Field

The disclosure relates to a detection device, and particularly relates to a detection method for detecting whether a light emitting element fails and a detection device.

Description of Related Art

With the technical development of light emitting elements, the sizes of the light emitting elements are gradually reduced and the number of light emitting elements used is gradually increased to facilitate application in various technical fields. Therefore, how to quickly and massively detect whether the light emitting elements can operate normally is one of the main issues discussed by persons skilled in the art.

SUMMARY

The disclosure provides a detection device and a detection method for a light emitting element, which may use a piezoelectricity sensor to detect whether the light emitting element can emit light normally.

In an embodiment of the disclosure, the detection device is used to detect a light emitting element. The detection device includes a piezoelectricity sensor and a light sensing circuit. The piezoelectricity sensor includes a first piezoelectricity element. The first piezoelectricity element is used to contact a first electrode of the light emitting element to cause a first deformation of the first piezoelectricity element. The first piezoelectricity element generates a first voltage based on the first deformation to power the first electrode. A second electrode of the light emitting element is coupled to a reference voltage. The light sensing circuit is used to sense whether the light emitting element powered by the first voltage emits light.

In an embodiment of the disclosure, the detection method for the light emitting element includes the following steps. A piezoelectricity sensor is overlaid on the light emitting element, so that a first piezoelectricity element of the piezoelectricity sensor contacts a first electrode of the light emitting element to cause a first deformation of the first piezoelectricity element. A second electrode of the light emitting element is coupled to a reference voltage. A first voltage is generated by the first piezoelectricity element based on the first deformation to power the first electrode. Whether the light emitting element powered by the first voltage emits light is sensed through the light sensing circuit.

Based on the above, the detection device according to the embodiments of the disclosure can detect whether the light emitting element fails. Through overlaying the piezoelectricity sensor on the light emitting element, the first piezoelectricity element in the piezoelectricity sensor contacts the first electrode of the light emitting element to cause the first deformation of the first piezoelectricity element, so as to generate the first voltage powering the first electrode of the light emitting element. During a transient period when the first piezoelectricity element generates the first voltage, the light sensing circuit may sense whether the light emitting element powered by the first voltage emits light, thereby judging whether the light emitting element may operate normally.

In order for the features and advantages of the disclosure to be more comprehensible, the following specific embodiments are described in detail in conjunction with the drawings.

DETAILED DESCRIPTION OF DISCLOSED EMBODIMENTS

The term "coupling (or connection)" used in the full text of the specification (including the claims) of the disclosure may refer to any direct or indirect connection means. For example, if it is described in the text that a first device is coupled (or connected) to a second device, it should be interpreted as that the first device may be directly connected to the second device or the first device may be indirectly connected to the second device through other devices or a certain connection means. Terms such as "first" and "second" mentioned in the full text of the specification (including the claims) of the disclosure are used to name elements or to distinguish different embodiments or ranges and are not used to limit an upper limit or a lower limit of the number of the elements or to limit the sequence of the elements. In addition, wherever possible, elements/components/steps using the same reference numerals in the drawings and embodiments represent the same or similar parts. Descriptions of the elements/components/steps using the same reference numerals or using the same terms in different embodiments may be cross-referenced.

Figure 1:
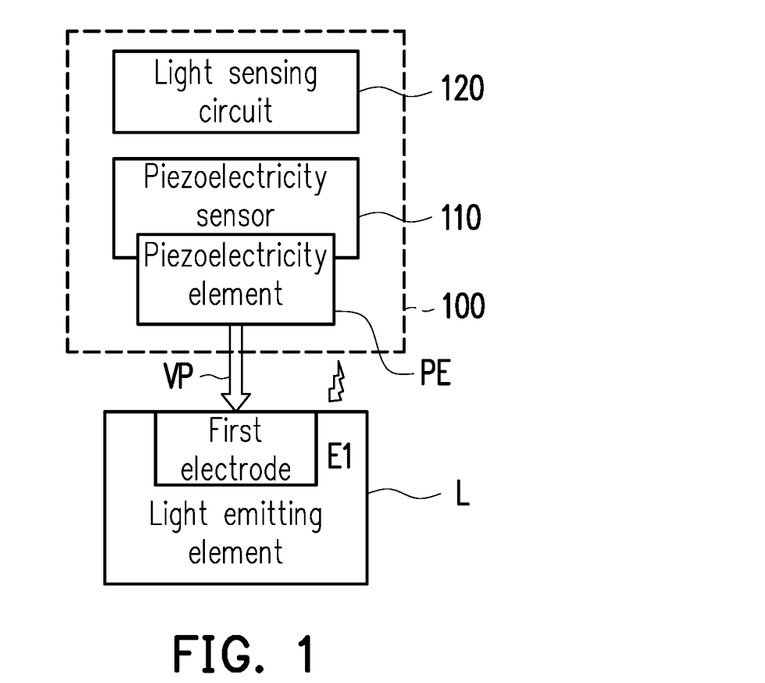
FIG. 1 is a schematic view of a circuit block of a detection device according to an embodiment of the disclosure.

FIG. 1 is a schematic view of a circuit block of a detection device 100 according to an embodiment of the disclosure. In the embodiment shown in FIG. 1, the detection device 100 includes a piezoelectricity sensor 110 and a light sensing circuit 120. The piezoelectricity sensor 110 includes one or more piezoelectricity elements PE. The piezoelectricity element PE may be deformed through being applied with a force (pressure) to generate a voltage VP (piezoelectric effect), so as to power a light emitting element L. In some embodiments, the piezoelectricity element PE may be fixed to the piezoelectricity sensor 110 through a holder. It should be noted that although FIG. 1 uses a single piezoelectricity element PE and a single light emitting element L as illustrative examples, the actual numbers of the piezoelectricity element PE and the light emitting element L may be determined according to the actual design/application, which are not limited in the embodiment. According to the actual application, the light emitting element L may be a light emitting diode (LED), a micro LED, a transparent organic LED (OLED), an electroluminescence (EL) element, a quantum dot LED (QD LED), a QD OLED, a QD EL element, a laser diode with a vertical type, a lateral type, or other packaging forms, or other types of light emitting elements, which is not limited in the embodiment. During a period when the piezoelectricity element PE powers the light emitting element L, the light sensing circuit 120 may sense whether the light emitting element L emits light. A system (not shown) may judge whether the light emitting element L may operate normally based on a sensing result of the light sensing circuit 120. In some embodiments, the light sensing circuit 120 may include an image capture device, a light detector, an electrical detector, and/or other light sensing circuits, which will be described in more detail in subsequent embodiments.

Figure 2:
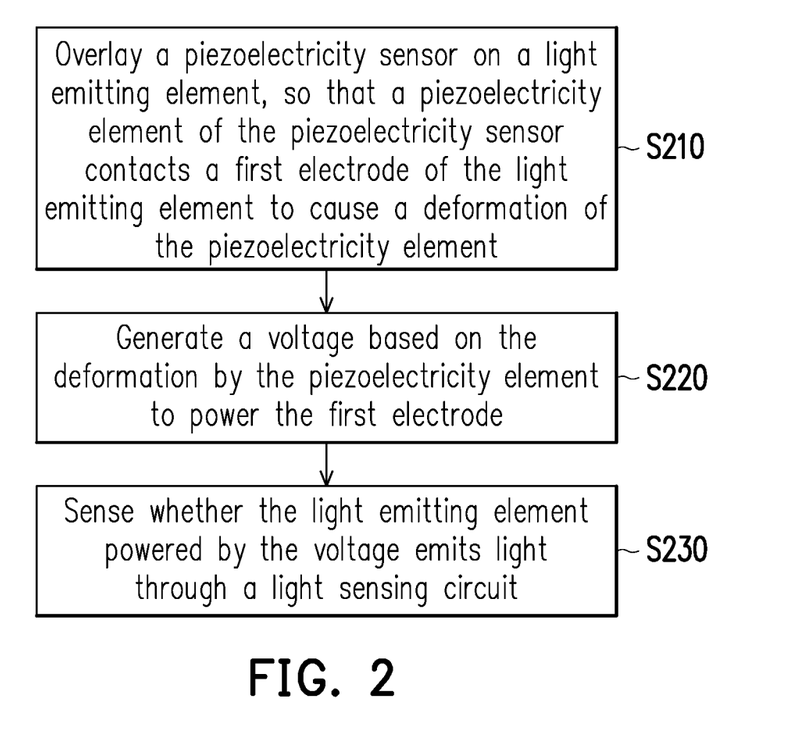
FIG. 2 is a flowchart of a detection method for a light emitting element according to an embodiment of the disclosure.

FIG. 2 is a schematic view of a flowchart of a detection method for a light emitting element according to an embodiment of the disclosure. For the detection device 100 shown in FIG. 1, reference may be made to the related description of FIG. 2. Please refer to FIG. 1 and FIG. 2 at the same time. In Step S210, the piezoelectricity sensor 110 may be overlaid on the light emitting element L, so that the piezoelectricity element PE of the piezoelectricity sensor 110 contacts a first electrode E1 of the light emitting element L to cause a deformation of the piezoelectricity element PE. In Step S220, the piezoelectricity element PE may generate the voltage VP based on the deformation to power the first electrode E1 of the light emitting element L. During a transient period when the piezoelectricity element PE generates the voltage VP, the light sensing circuit 120 may sense whether the light emitting element L powered by the voltage VP emits light (Step S230).

Figure 3A:
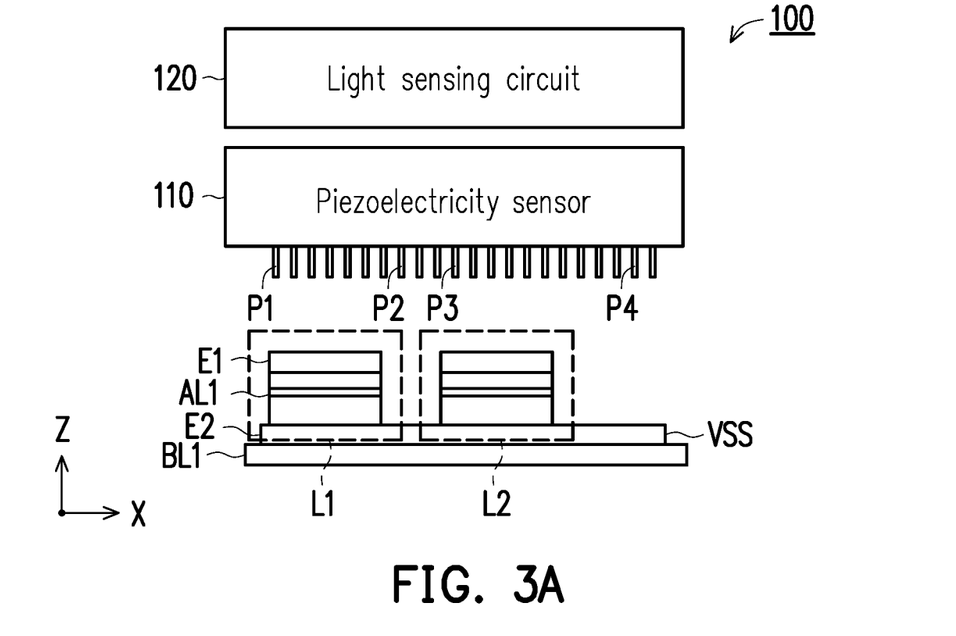
FIG. 3A and FIG. 3B are schematic views illustrating an operation situation of a detection device according to an embodiment of the disclosure.
Figure 3B:
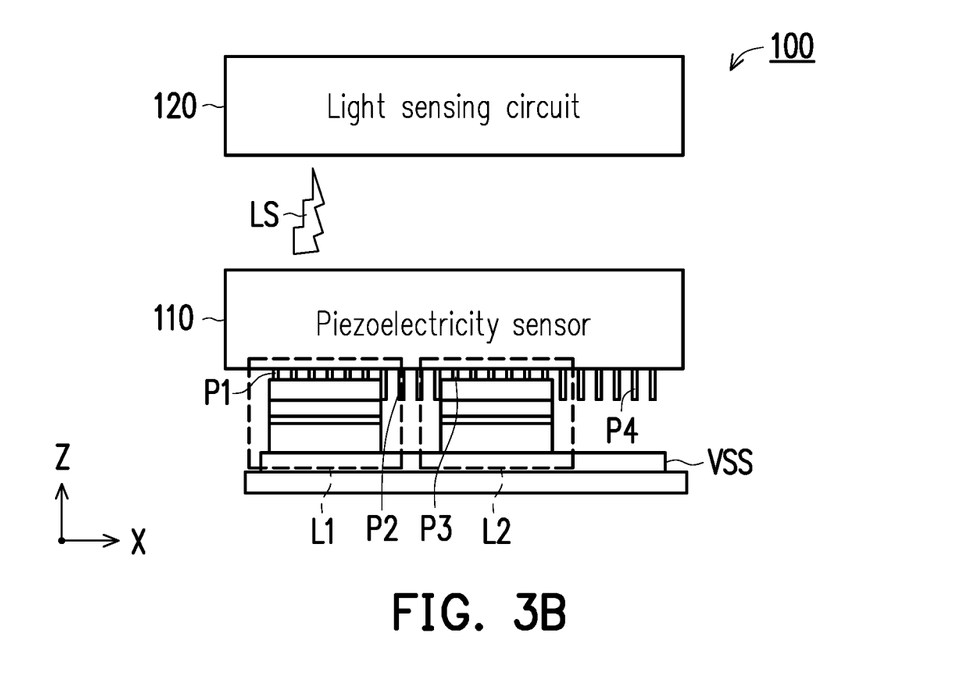

For example, FIG. 3A and FIG. 3B are schematic views illustrating an operation situation of the detection device 100 according to an embodiment of the disclosure. Here, a light emitting element L1 and a light emitting element L2 in the form of the vertical type packaging are taken as examples. FIG. 3A shows a side perspective schematic view before the piezoelectricity sensor 110 is overlaid on the light emitting elements L1 and L2, and FIG. 3B shows a side perspective schematic view after the piezoelectricity sensor 110 is overlaid on the light emitting elements L1 and L2. The horizontal axis shown in FIG. 3A and FIG. 3B represents an X-axis of an X-Z two-dimensional plane, and the vertical axis represents a Z-axis of the X-Z two-dimensional plane. The actual structures, numbers, and specific distribution manners of the light emitting elements L1 and L2 may be set according to the actual design, which are not limited in the embodiment. For example, in the embodiment, the light emitting element L1 may include the first electrode E1, an active layer AL1, and a second electrode E2 sequentially disposed on a holder BL1. In some embodiments, the light emitting element L1 may further include a P-type semiconductor layer (that is, a semi-P layer) and/or an N-type semiconductor layer (that is, a semi-N layer). For example, the P-type semiconductor layer may be disposed between the first electrode E1 and the light emitting layer AL1, and the N-type semiconductor layer may be disposed between the light emitting layer AL1 and the second electrode E2. The implementation of the light emitting element L2 may be analogized with reference to the relevant description of the light emitting element L1, so there will be no repetition.

In the embodiment shown in FIG. 3A and FIG. 3B, the piezoelectricity sensor 110 may include multiple piezoelectricity elements (for example, a piezoelectricity element P1, a piezoelectricity element P2, a piezoelectricity element P3, and a piezoelectricity element P4 in the drawings). The piezoelectricity element PE shown in FIG. 1 may refer to the relevant description of any one of the piezoelectricity elements P1 to P4 shown in FIG. 3A and FIG. 3B, and/or any one of the piezoelectricity elements P1 to P4 shown in FIG. 3A and FIG. 3B may refer to the relevant description of the piezoelectricity element PE shown in FIG. 1. The actual numbers and specific distribution manners of the piezoelectricity elements P1 to P4 shown in FIG. 3A and FIG. 3B may be set according to the actual design, which are not limited in the embodiment. For example, in some embodiments, the piezoelectricity sensor 110 may only include the piezoelectricity elements P1 and P3 to respectively correspond to the first electrode E1 of the light emitting element L1 and a first electrode of the light emitting element L2. Alternatively, as shown in FIG. 3A, multiple piezoelectricity elements correspond to a single light emitting element (L1 or L2). In detail, in the embodiment shown in FIG. 3A, before the piezoelectricity sensor 110 is overlaid on the light emitting elements L1 and L2, the piezoelectricity elements P1 to P4 are all suspended. Since the light emitting elements L1 and L2 are not powered on yet, the light emitting elements L1 and L2 both do not emit light.

In the embodiment shown in FIG. 3B, taking the light emitting element L1 as an example, after the piezoelectricity sensor 110 is overlaid on the light emitting element L1, a first end portion of the piezoelectricity element P1 in the piezoelectricity sensor 110 may contact the first electrode of the light emitting element L1 E1. A second end portion of the piezoelectricity element P1 may be coupled to a reference voltage VSS. The piezoelectricity element P1 may be deformed by contacting the light emitting element L1. The piezoelectricity element P1 may generate a voltage based on the deformation to power the first electrode E1 of the light emitting element L1. In some embodiments, the second electrode E2 of the light emitting element L1 may be coupled to the reference voltage VSS. The reference voltage VSS may have, for example, a direct current low level, a ground level, or other voltage values different from the voltage generated by the piezoelectricity element P1. In this way, the light emitting element L1 may generate a light LS based on a voltage difference between the first electrode E1 and the second electrode E2.

By analogy, in the embodiment, after the piezoelectricity sensor 110 is overlaid on the light emitting element L2, the piezoelectricity element P3 in the piezoelectricity sensor 110 may contact the first electrode of the light emitting element L2 to be deformed, so that the piezoelectricity element P3 may generate a voltage based on the deformation to power the first electrode of the light emitting element L2. It is assumed here that the light emitting element L2 is a failed element, so during the transient period when the piezoelectricity element P3 generates the voltage to the light emitting element L2, the light emitting element L2 does not generate light. Therefore, the light sensing circuit 120 may judge whether the light emitting element L1 and/or the light emitting element L2 may operate normally through sensing whether the light emitting element L1 and/or the light emitting element L2 emit light. In addition, in the embodiment, the piezoelectricity elements P2 and P4 do not contact the light emitting element L1 or L2, so the piezoelectricity elements P2 and P4 are not deformed to generate voltages.

Figure 4A:
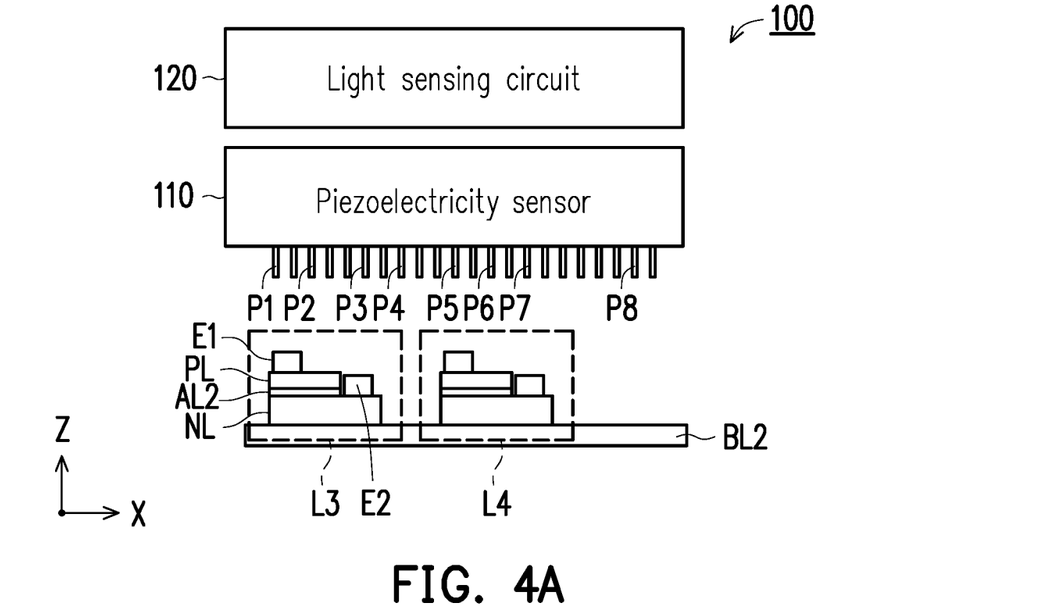
FIG. 4A and FIG. 4B are schematic views illustrating an operation situation of a detection device according to another embodiment of the disclosure.
Figure 4B:
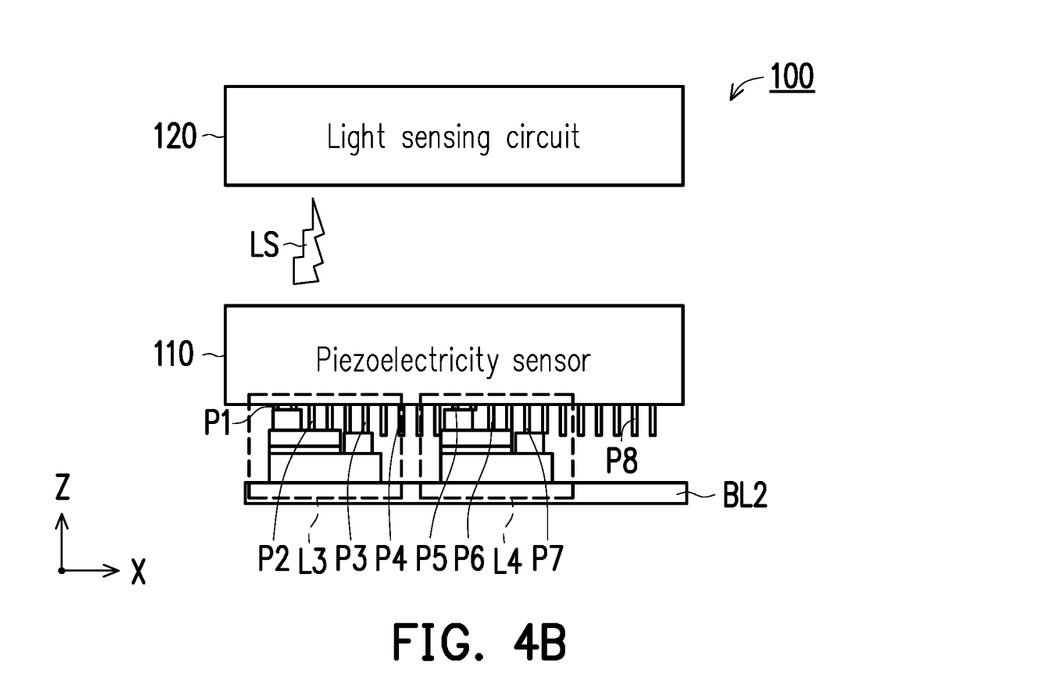

For another example, FIG. 4A and FIG. 4B are schematic views illustrating an operation situation of the detection device 100 according to another embodiment of the disclosure. The difference from the embodiment shown in FIG. 3A and FIG. 3B is that the embodiment shown in FIG. 4A and FIG. 4B uses a light emitting element L3 and a light emitting element L4 in the form of the lateral type packaging as examples. FIG. 4A shows a side perspective schematic view before the piezoelectricity sensor 110 is overlaid on the light emitting elements L3 and L4, and FIG. 4B shows a side perspective schematic view after the piezoelectricity sensor 110 is overlaid on the light emitting elements L3 and L4. The horizontal axis shown in FIG. 4A and FIG. 4B represents the X-axis of the X-Z two-dimensional plane, and the vertical axis represents the Z-axis of the X-Z two-dimensional plane. The actual structures, numbers, and specific distribution manners of the light emitting elements L3 and L4 may be set according to the actual design, which are not limited in the embodiment. For example, in the embodiment, the light emitting element L3 may include the first electrode E1, a P-type semiconductor layer PL, a light emitting layer AL2, an N-type semiconductor layer NL, and the second electrode E2. The N-type semiconductor layer NL is disposed on a holder BL2. The light emitting layer AL2 is disposed between the P-type semiconductor layer PL and the N-type semiconductor layer NL. The first electrode E1 is disposed on the P-type semiconductor layer PL. The second electrode E2 is disposed on the N-type semiconductor layer NL. As such, the relative distance between the first electrode E1 and the piezoelectricity sensor 110 is different from the relative distance between the second electrode E2 and the piezoelectricity sensor 110. The implementation of the light emitting element L4 may be analogized with reference to the relevant description of the light emitting element L3, so there will be no repetition.

In the embodiment shown in FIG. 4A and FIG. 4B, the piezoelectricity sensor 110 may include multiple piezoelectricity elements (for example, the piezoelectricity element P1, the piezoelectricity element P2, the piezoelectricity element P3, the piezoelectricity element P4, the piezoelectricity element P5, the piezoelectricity element P6, the piezoelectricity element P7, and the piezoelectricity element P8). The piezoelectricity element PE shown in FIG. 1 may refer to the relevant description of any one of the piezoelectricity elements P1 to P8 shown in FIG. 4A and FIG. 4B, and/or any one of the piezoelectricity elements P1 to P8 shown in FIG. 4A and FIG. 4B may refer to the relevant description of the piezoelectricity element PE shown in FIG. 1. The actual numbers and specific distribution manners of the piezoelectricity elements P1 to P8 shown in FIG. 4A and FIG. 4B may be set according to the actual design, which are not limited in the embodiment. For example, in some embodiments, the piezoelectricity sensor 110 may include only the piezoelectricity elements P1, P3, P5, and P7, wherein the piezoelectricity elements P1 and P3 respectively correspond to the first electrode E1 and the second electrode E2 of the light emitting element L3, and the piezoelectricity elements P5 and P7 respectively correspond to the first electrode and the second electrode of the light emitting element L4. In the operation situation shown in FIG. 4A, before the piezoelectricity sensor 110 is overlaid on the light emitting elements L3 and L4, the piezoelectricity elements P1 to P8 are all suspended. Since the light emitting elements L3 and L4 are not powered on yet, the light emitting elements L3 and L4 both do not emit light.

In the operation situation shown in FIG. 4B, taking the light emitting element L3 as an example, after the piezoelectric sensor 110 is overlaid on the light emitting element L3, the first end portion of the piezoelectricity element P1 may contact the first electrode E1 of the light emitting element L3, and a first end portion of the piezoelectricity element P3 may contact the second electrode E2 of the light emitting element L3. Second end portions of the piezoelectricity elements P1 to P8 may be electrically connected to one another. Based on the relative distance between the first electrode E1 and the piezoelectricity sensor 110 and the relative distance between the second electrode E2 and the piezoelectricity sensor 110 being different, when the piezoelectricity elements P1 and P3 respectively contact the first electrode E1 and the second electrode E2, the piezoelectricity elements P1 and P3 undergo different degrees of deformations (for example, respectively a first deformation and a second deformation). In this way, the piezoelectricity elements P1 and P3 may respectively generate different voltages (for example, respectively a first voltage and a second voltage) based on different deformations to the first electrode E1 and the second electrode E2 of the light emitting element L3. The light emitting element L1 may generate the light LS according to the voltage difference between the first electrode E1 and the second electrode E2.

By analogy, in the embodiment, after the piezoelectricity sensor 110 is overlaid on the light emitting element L4, the piezoelectricity elements P5 and P7 in the piezoelectricity sensor 110 respectively contact the first electrode and the second electrode of the light emitting element L4 and undergo different deformations, so that the piezoelectricity elements P5 and P7 may respectively supply different voltages to the first electrode and the second electrode of the light emitting element L4 based on different deformations. Here, it is assumed that the light emitting element L4 is a failed element, so during the transient period when the piezoelectricity elements P5 and P7 respectively generate the first voltage and the second voltage to the light emitting element L4, the light emitting element L4 does not generate light. Therefore, the light sensing circuit 120 may judge whether the light emitting element L3 and/or the light emitting element L4 may operate normally through sensing whether the light emitting element L3 and/or the light emitting element L4 emit light.

In addition, in the embodiment, the piezoelectricity elements P4 and P8 do not contact the light emitting element L3 or L4, so the piezoelectricity elements P4 and P8 are not deformed to generate voltages. Furthermore, in the embodiment, the piezoelectricity elements P2 and P6 respectively contact insulating layers of the light emitting elements L3 and L4, so the piezoelectricity elements P4 and P8 do not affect the detection operation of the light emitting element L3 or L4.

Figure 5A:
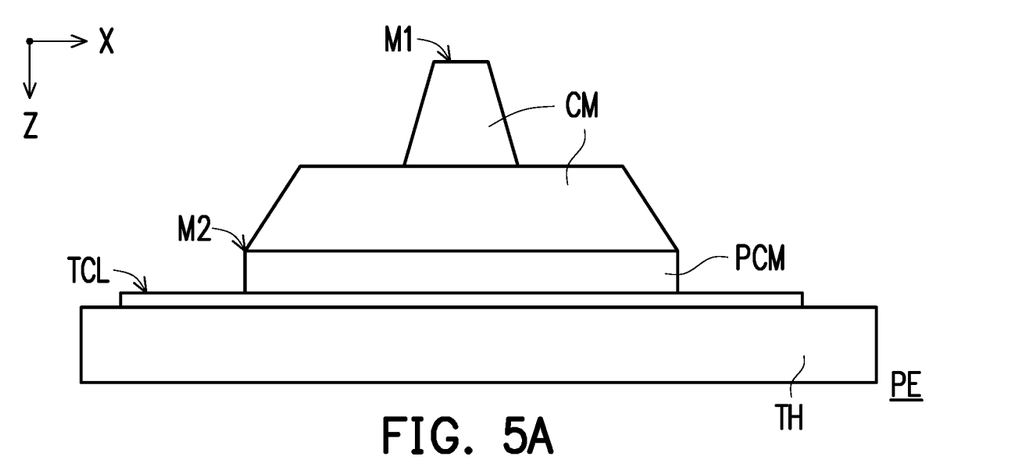
FIG. 5A, FIG. 5B, and FIG. 5C are side schematic views of a hardware structure of a piezoelectricity sensor according to different embodiments of the disclosure.
Figure 5B:
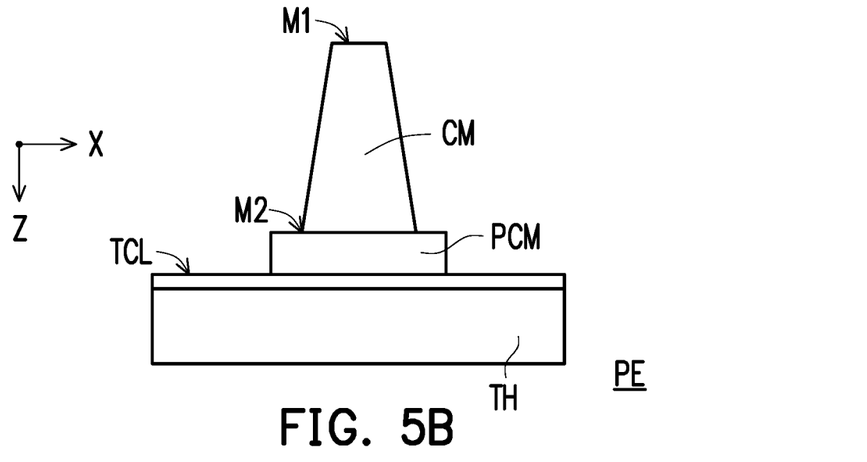
Figure 5C:
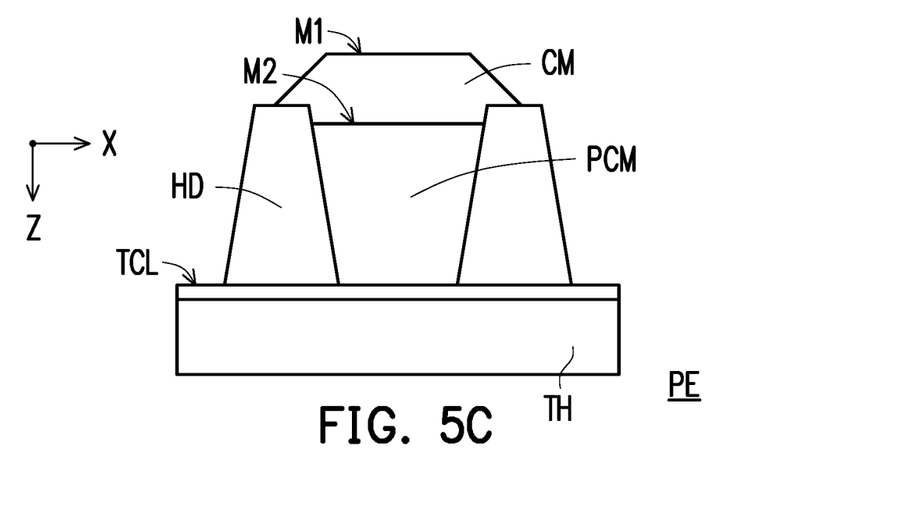

FIG. 5A, FIG. 5B, and FIG. 5C are side schematic views of the hardware structure of the piezoelectricity element PE according to different embodiments of the disclosure. The horizontal axis shown in FIG. 5A, FIG. 5B, and FIG. 5C represents the X-axis of the X-Z two-dimensional plane, and the vertical axis represents the Z-axis of the X-Z two-dimensional plane. According to the actual design, the piezoelectricity element PE shown in FIG. 1, any of the piezoelectricity elements P1 to P4 shown in FIG. 3A and FIG. 3B, and/or any one of the piezoelectricity elements P1 to P8 shown in FIG. 4A and FIG. 4B may be analogized with reference to the relevant description of the piezoelectricity element PE shown in FIG. 5A, FIG. 5B, or FIG. 5C.

In the embodiment shown in FIG. 5A, the piezoelectricity element PE may include a conductive material CM, a piezoelectricity material PCM, a transparent conductive layer TCL, and a transparent holder TH. According to the actual design, the material of the transparent conductive layer TCL may include indium tin oxide (ITO) or other transparent conductive materials. According to the actual design, the material of the transparent holder TH may include glass, plastic sheet (for example, poly methyl methacrylate (PMMA), polyethylene terephthalate (PET), etc.), and/or other transparent holder materials. In some embodiments, the transparent holder TH may include a stack structure of ultra-thin glass and polyimide (PI). In still other embodiments, the transparent holder TH may include a stack structure of ultra-thin glass and film. In other embodiments, the material of the transparent holder TH may include a stack structure of ultra-thin glass, film, and ultra-thin glass. In detail, the conductive material CM has a first end portion M1 and a second end portion M2, wherein the first end portion M1 is used to contact the first electrode E1 of the light emitting element. The piezoelectricity material PCM is connected to the second end portion M2 of the conductive material CM. The piezoelectricity material PCM is disposed between the transparent conductive layer TCL and the conductive material CM. The transparent conductive layer TCL is disposed on a surface of the transparent holder TH, and the transparent conductive layer TCL is disposed between the transparent holder TH and the piezoelectricity material PCM.

In the embodiment shown in FIG. 5B, the piezoelectricity element PE may include the conductive material CM, the piezoelectricity material PCM, the transparent conductive layer TCL, and the transparent holder TH. The conductive material CM, the piezoelectricity material PCM, the transparent conductive layer TCL, and the transparent holder TH shown in FIG. 5B may be analogized with reference to the related description of the conductive material CM, the piezoelectricity material PCM, the transparent conductive layer TCL, and the transparent holder TH shown in FIG. 5A, so there will be no repetition. The difference from the embodiment shown in FIG. 5A is that the shapes and sizes of the conductive material CM and the piezoelectricity material PCM shown in FIG. 5B may be different from the embodiment shown in FIG. 5A.

In the embodiment shown in FIG. 5C, the piezoelectricity element PE may include the conductive material CM, the piezoelectricity material PCM, the transparent conductive layer TCL, and the transparent holder TH. The conductive material CM, the piezoelectricity material PCM, the transparent conductive layer TCL, and the transparent holder TH shown in FIG. 5C may be analogized with reference to the related description of the conductive material CM, the piezoelectricity material PCM, the transparent conductive layer TCL, and the transparent holder TH shown in FIG. 5A, so there will be no repetition. According to design requirements, the piezoelectricity element PE shown in FIG. 5C may also include a holding structure HD disposed on the transparent holder TH. The holding structure HD may be used to hold the conductive material CM and the piezoelectricity material PCM. In addition, the shapes of the conductive material CM and the piezoelectricity material PCM and the contact areas between the conductive material CM, the piezoelectricity material PCM, and the transparent conductive layer TCL shown in FIG. 5C may also be different from the embodiments shown in FIG. 5A and/or FIG. 5B.

According to actual application requirements, the piezoelectricity material PCM in FIG. 5A, FIG. 5B, and/or FIG. 5C may include BaTiO$_3$, lead-zirconate-titanate (PZT) film (for example, Pb(Zr$_x$Ti$_{1-x}$)O$_3$, $0 \leq x \leq 1$), AlN, ZnO, polyvinylidene fluoride (PVDF), or other piezoelectricity materials. The conductive material CM may include indium tin oxide (ITO), metal (for example, aluminum, aluminum oxide, indium, molybdenum, titanium, tantalum, chromium), anisotropic conductive film (ACF) (for example, acrylate rubber polymer with conductive microspheres), soft conductive material (for example, metal film, dielectric/thin metal/dielectric (DMD) composite structure, organic conductive polymer), conductive carbon material (for example, graphene, carbon nanotube), metal mesh, metal web, or other conductive materials. The holding structure HD may include epoxy resin, polyepoxide, epichlorohydrin, PMMA, polycarbonate, or other non-conductive holder materials.

Figure 6:
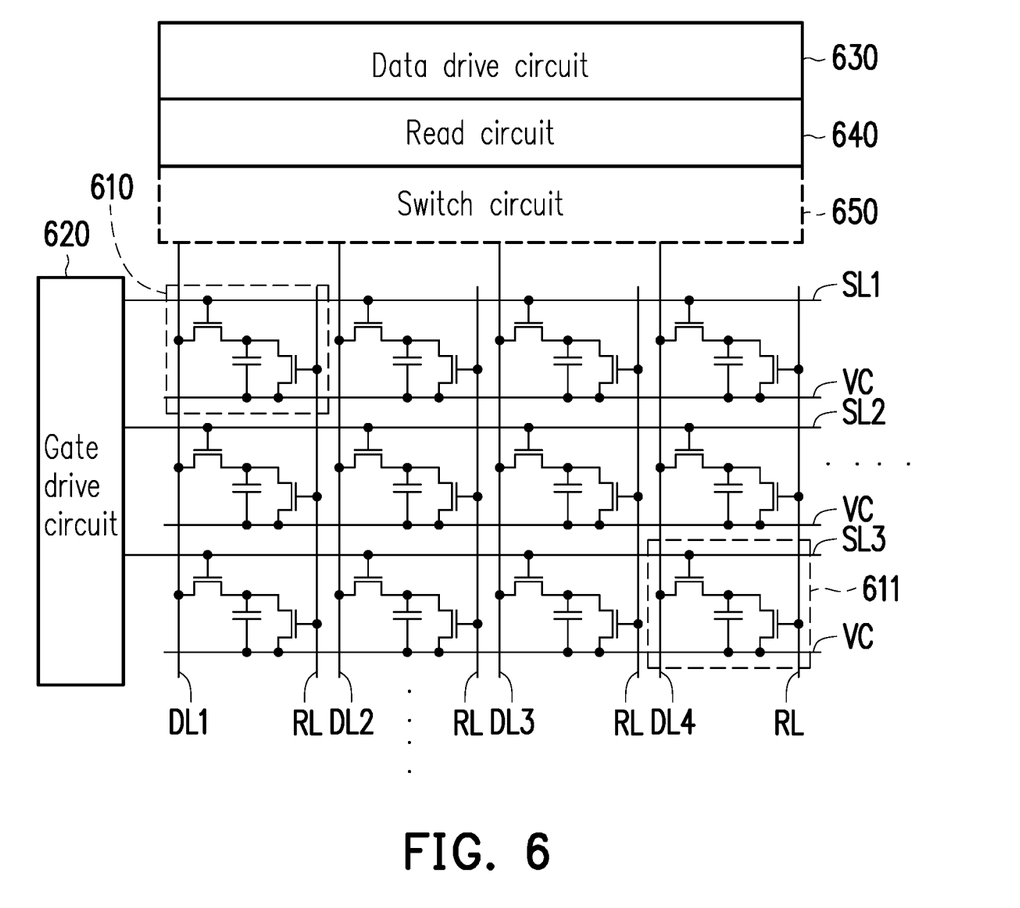
FIG. 6 is a schematic view of a circuit block of a light sensing circuit according to an embodiment of the disclosure.

FIG. 6 is a schematic view of a circuit block of the light sensing circuit 120 according to an embodiment of the disclosure. According to the actual design, the light sensing circuit 120 shown in FIG. 1, FIG. 3A, FIG. 3B, FIG. 4A, and/or FIG. 4B may be analogized with reference to the related description of the light sensing circuit 120 shown in FIG. 6. Please refer to FIG. 1 and FIG. 6 at the same time. In the embodiment shown in FIG. 6, according to actual requirements, the light sensing circuit 120 may include one or more pixel circuits (for example, a pixel circuit 610 and a pixel circuit 611) to sense whether one or more light emitting elements (for example, the light emitting element L shown in FIG. 1, the light emitting elements L1 and L2 shown in FIG. 3A and FIG. 3B, and/or the light emitting elements L3 and L4 shown in FIG. 4A and FIG. 4B) emit light. The structures, numbers, and specific distribution manners of the pixel circuits 610 and 611 may be set according to the actual design, which are not limited in the embodiment. Taking the pixel circuit 610 as an example, in some embodiments, the pixel circuit 610 may include a sensing switch TS1 and a capacitor CS1, and the capacitor CS1 is coupled to the sensing switch TS1. Then, during the period when the piezoelectricity element PE shown in FIG. 1 generates the voltage VP to power the light emitting element L, the pixel circuit 610 may be set to receive the light emitted by the light emitting element L, so that the amount of light of the light emitting element L changes the leakage rate of the sensing switch TS1 to the capacitor CS1 in the pixel circuit 610, so as to judge whether the light emitting element L emits light according to the voltage change of the capacitor CS1.

For example, in some embodiments, a first end of the sensing switch TS1 in the pixel circuit 610 may be coupled to a data line DL1, and a control end of the sensing switch TS1 may be coupled to a scan line SL1. A first end of the capacitor CS1 may be coupled to a second end of the sensing switch TS1, and a second end of the capacitor CS1 may receive a common voltage VC. By analogy, a first end of a sensing switch TS2 in the pixel circuit 611 may be coupled to a data line DL4, and a control end of the sensing switch TS2 may be coupled to a scan line SL3. A first end of the capacitor CS2 may be coupled to a second end of the sensing switch TS2, a second end of the capacitor CS2 may receive the common voltage VC, and other pixel circuits may be analogized, so there will be no repetition. In some embodiments, the light sensing circuit 120 may include a gate drive circuit 620, a data drive circuit 630, and a read circuit 640. The gate drive circuit 620 may be coupled to the scan lines SL1 to SL3, and the data drive circuit 630 and the read circuit 640 may be coupled to the data lines DL1 to DL4. In some embodiments, the gate drive circuit 620 may sequentially turn on the sensing switches TS1 and TS2 in the pixel circuits 610 and 611 through the scan lines SL1 to SL3, and the data drive circuit 630 may sequentially transmit initial voltages to the capacitors CS1 and CS2 through the data lines DL1 to DL4 and the sensing switches TS1 and TS2. The read circuit 640 may sequentially read leakage voltages of the capacitors CS1 and CS2 through the data lines DL1 to DL4 and the sensing switches TS1 and TS2. In this way, in some embodiments, the read circuit 640 (or other external devices) may judge whether a corresponding light emitting element emits light when the piezoelectricity sensor 110 powers the corresponding light emitting element according to a difference between the leakage voltages and the initial voltages of the capacitors CS1 and CS2.

In some embodiments, the pixel circuit 610 shown in FIG. 6 may further include a reset switch TR1. A first end of the reset switch TR1 may be coupled to the first end of the capacitor CS1, a second end of the reset switch TR1 may receive the common voltage VC, a control end of the reset switch TR1 may be coupled to a reset line RL, and the remaining pixel circuit (for example, the pixel circuit 611) may be analogized. In some embodiments, the light sensing circuit 120 may further include a controller (not shown) or other drive circuits. The controller may be coupled to the reset line RL to turn on the reset switch TR1 through the reset line RL, so as to reset a voltage of the first end of the capacitor CS1 to the common voltage VC. According to design requirements, the controller may be a central processing unit (CPU), a microcontroller unit (MCU), a digital signal processor (DSP), a programmable logic controller (PLC), a digital signal processor (DSP), an application specific integrated circuit (ASIC), a programmable logic device (PLD), other similar devices, or a combination of the devices. In other embodiments, the controller may also implement various operation functions in the form of a hardware circuit, and the detailed steps and implementations thereof may be adequately taught, suggested, and implemented by persons skilled in the art.

Figure 7:
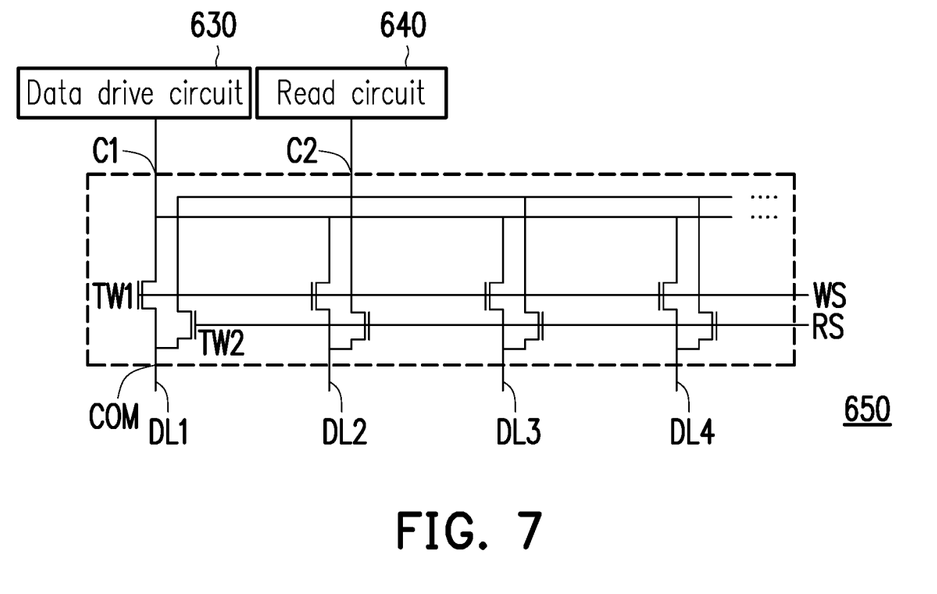
FIG. 7 is a schematic view of a circuit illustrating a switch circuit shown in FIG. 6 according to an embodiment of the disclosure.

In some embodiments, the light sensing circuit 120 may further include a switch circuit 650 to couple the data lines DL1 to DL4 to the data drive circuit 630 or the read circuit 640. For example, FIG. 7 is a schematic view of a circuit illustrating the switch circuit 650 shown in FIG. 6 according to an embodiment of the disclosure. In the embodiment shown in FIG. 7, taking the switching of the data line DL1 as an example, the switch circuit 650 may include a first selection end C1, a second selection end C2, and a common end COM. The first selection end C1 of the switch circuit 650 may be coupled to the data drive circuit 630, the second selection end C2 of the switch circuit 650 may be coupled to the read circuit 640, and the common end of the switch circuit 650 may be coupled to the data line DL1. In some embodiments, the switch circuit 650 may include multiple switching switches (for example, switching switches TW1 and TW2), wherein a first end of the switching switch TW1 and a first end of the switching switch TW2 may be respectively coupled to the first selection end C1 and the second selection end C2 of the switch circuit 650, a second end of the switching switch TW1 and a second end of the switching switch TW2 may be jointly coupled to the common end COM of the switch circuit 650, and a control end of the switching switch TW1 and a control end of the switching switch TW2 may respectively receive a write signal WS and a read signal RS. The write signal WS and the read signal RS may be generated through the controller (not shown) or other drive circuits. For example, in some embodiments, the controller may respectively generate the write signal WS and the read signal RS during a write period and a read period to respectively turn on the switching switches TW1 and TW2. In this way, the switch circuit 650 may electrically connect the common end COM to the first selection end C1 during the write period, and electrically connect the common end COM to the second selection end C2 during the read period to switch the connection manner between the data line DL1, the data drive circuit 630, and the read circuit 640. The switching manners of the remaining data lines DL1 to DL4 may be analogized, so there will be no repetition.

Figure 8:
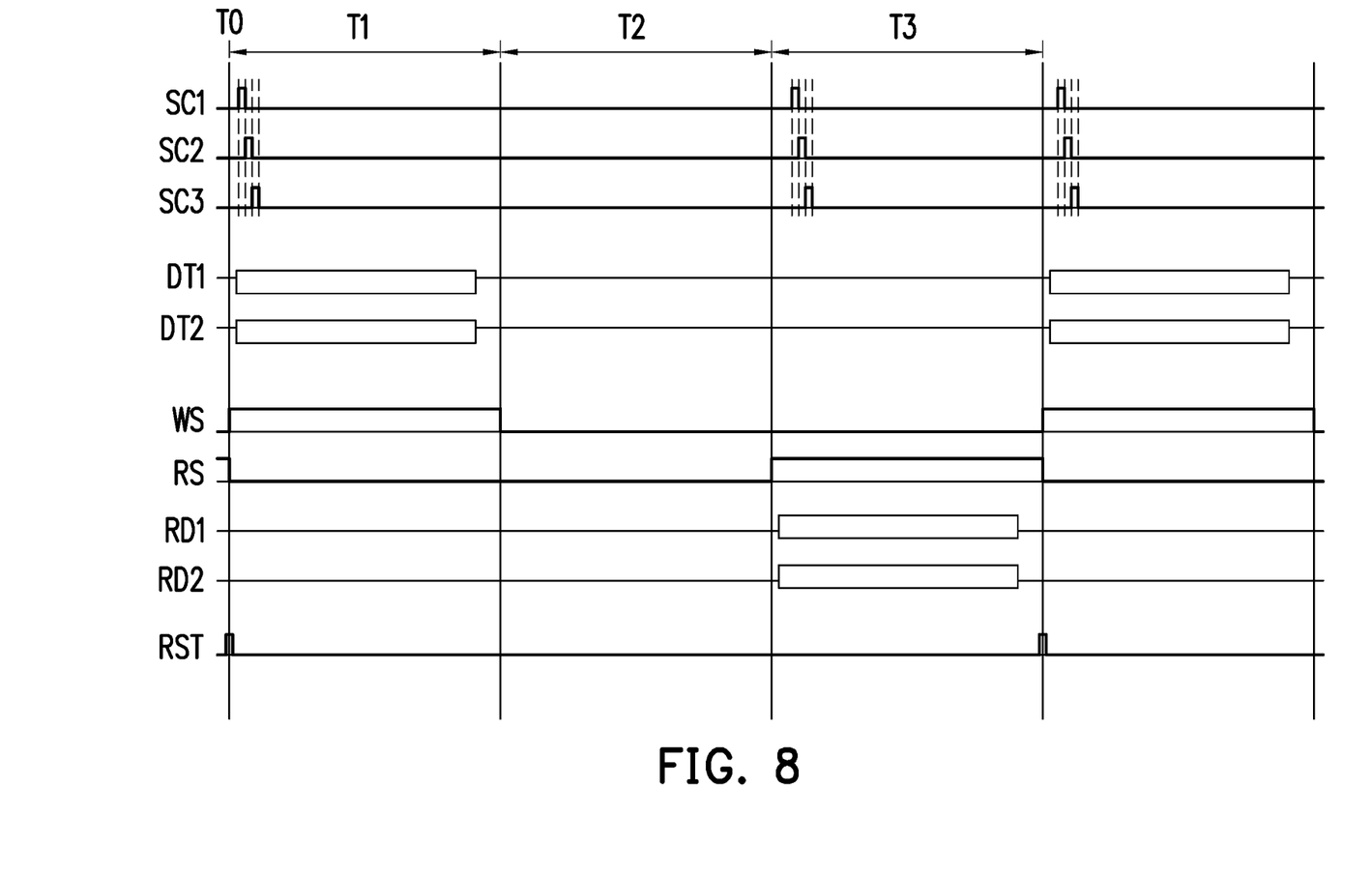
FIG. 8 is a schematic view illustrating operation waveform of the light sensing circuit shown in FIG. 6 according to an embodiment of the disclosure.

For example, FIG. 8 is a schematic view illustrating operation waveform of the light sensing circuit 120 shown in FIG. 6 according to an embodiment of the disclosure. Taking the pixel circuit 610 shown in FIG. 6 as an example, in the embodiment shown in FIG. 8, during a reset period T0, a reset signal RST may be transmitted to the reset line RL through the controller or other drive circuits to turn on the reset switch TR1 of the pixel circuit 610, so as to reset the voltage of the first end of the capacitor CS1 of the pixel circuit 610 to the common voltage VC. During a write period T1, the gate drive circuit 620 may transmit a scan signal SC1 to the scan line SL1 to turn on the sensing switch TS1 of the pixel circuit 610, and the data drive circuit 630 may transmit an initial voltage DT1 to the capacitor CS1 through the data line DL1 and the sensing switch TS1. In some embodiments, the controller or other drive circuits may also transmit the write signal WS to the switch circuit 650 to control the switch circuit 650 to electrically connect the data line DL1 to the data drive circuit 630, so that the data drive circuit 630 may transmit the initial voltage DT1 to the capacitor CS1 through the switch circuit 650, the data line DL1, and the sensing switch TS1.

During a sense period T2, the piezoelectricity sensor may be overlaid on the light emitting element, so that the piezoelectricity element in the piezoelectricity sensor may generate the voltage based on the deformation to power the light emitting element. Assuming that at this time, the light emitting element is powered on and emits light, and the pixel circuit 610 in the light sensing circuit 120 correspondingly receives the light emitted by the light emitting element, then the amount of light may change the leakage rate of the sensing switch TS1 to the capacitor CS1 of the pixel circuit 610, so that the degree of voltage drop of the initial voltage DT1 stored in the capacitor CS1 changes (compared to the case of no leakage). During a read period T3, the gate drive circuit 620 may transmit the scan signal SC1 to the scan line SL1 to turn on the sensing switch TS1 of the pixel circuit 610, and the read circuit 640 may read a leakage voltage RD1 of the capacitor CS1 through the data line DL1 and the sensing switch TS1. In some embodiments, the controller or other drive circuits may also transmit the read signal RS to the switch circuit 650 to control the switch circuit 650 to electrically connect the data line DL1 to the read circuit 640, so that the read circuit 640 may read the leakage voltage RD1 of the capacitor CS1 through the switch circuit 650, the data line DL1, and the sensing switch TS1.

In this way, the read circuit 640 or other external devices may judge whether the light emitting element emits light according to a difference between the leakage voltage RD1 and the initial voltage DT1 of the capacitor CS1. For example, in some embodiments, a threshold may be set, and the difference between the leakage voltage RD1 and the initial voltage DT1 may be compared with the threshold. For example, in some embodiments, the read circuit 640 or other external devices may respectively output a digital signal L and a digital signal H to respectively represent the difference between the leakage voltage RD1 and the initial voltage DT1 of the capacitor CS1 exceeding the threshold and not exceeding the threshold, so as to respectively reflect whether the light emitting element emits light. The operations from the reset period TO to the read period T3 may be repeatedly executed. The sensing process of other pixel circuits (for example, the pixel circuit 611) may be analogized, so there will be no repetition. In addition, in some embodiments, the read circuit 640 or other external devices may also judge the specific positions of the light emitting elements that emit light normally and/or abnormally (defective) according to the actual distribution positions of the pixel circuits 610 to 611, which is convenient for the user to interpret.

In summary, in the detection device 100 and the detection method for the light emitting element described in the embodiments of the disclosure, the piezoelectricity sensor 110 may be overlaid on one or more light emitting elements, so that one or more piezoelectricity elements of the piezoelectricity sensors 110 contact the first electrode of the light emitting element to cause the deformation of the piezoelectricity element, so as to generate voltage to power the first electrode of the light emitting element. In this way, it is possible to sense whether the light emitting element powered by the voltage generated by the piezoelectricity element emits light through the light sensing circuit 120, so as to judge whether the light emitting element may operate normally. In addition, the detection device 100 may also judge the actual distribution positions of the light emitting elements that are operating normally and/or fail to operate normally (defective), and the detection device 100 has functions such as fast detection and easy implementation.

Although the disclosure has been disclosed in the above embodiments, the embodiments are not intended to limit the disclosure. Persons skilled in the art may make some changes and modifications without departing from the spirit and scope of the disclosure. Therefore, the protection scope of the disclosure shall be defined by the appended claims.

What is claimed is:

1. A detection device, used to detect a light emitting element, the detection device comprising:
a piezoelectricity sensor, comprising a first piezoelectricity element, wherein the first piezoelectricity element is used to contact a first electrode of the light emitting element to cause a first deformation of the first piezoelectricity element, and the first piezoelectricity element generates a first voltage based on the first deformation to power the first electrode, wherein a second electrode of the light emitting element is coupled to a reference voltage; and
a light sensing circuit, used to sense whether the light emitting element powered by the first voltage emits light, wherein the light sensing circuit comprises a pixel circuit, and the pixel circuit comprises:
a sensing switch, having a first end coupled to a data line, wherein a control end of the sensing switch is coupled to a scan line; and
a capacitor, having a first end coupled to a second end of the sensing switch, wherein a second end of the capacitor receives a common voltage, and during a period when the first voltage powers the light emitting element, an amount of light of the light emitting element changes a leakage rate of the sensing switch to the capacitor.

2. The detection device according to claim 1, wherein the light emitting element comprises an organic light emitting diode, a micro light emitting diode, an electroluminescence element, a quantum dot light emitting diode, a quantum dot organic light emitting diode, a quantum dot electroluminescence element, or a laser diode.

3. The detection device according to claim 1, wherein the first piezoelectricity element comprises:
a conductive material, having a first end portion for contacting the first electrode of the light emitting element;
a piezoelectricity material, connected to a second end portion of the conductive material;
a transparent holder, wherein the piezoelectricity material is disposed between the transparent holder and the conductive material, and the transparent holder comprises a stack structure of glass, plastic sheet, ultra-thin glass, and polyimide, a stack structure of ultra-thin glass and film, or a stack structure of ultra-thin glass, film, and ultra-thin glass; and
a transparent conductive layer, disposed on a surface of the transparent holder, wherein the transparent conductive layer is disposed between the transparent holder and the piezoelectricity material.

4. The detection device according to claim 3, wherein the first piezoelectricity element comprises:
a holding structure, disposed on the transparent holder to hold the conductive material and the piezoelectricity material.

5. The detection device according to claim 1, wherein the light sensing circuit further comprises:
a gate drive circuit, coupled to the scan line and used to transmit a scan signal to the scan line to turn on the sensing switch during a write period and a read period;
a data drive circuit, coupled to the data line and used to transmit an initial voltage to the capacitor through the data line and the sensing switch during the write period; and
a read circuit, coupled to the data line and used to read a leakage voltage of the capacitor through the data line and the sensing switch during the read period.

6. The detection device according to claim 1, wherein the light sensing circuit further comprises:
a gate drive circuit, coupled to the scan line and used to transmit a scan signal to the scan line to turn on the sensing switch during a write period and a read period;
a switch circuit, having a common end coupled to the data line, wherein the switch circuit electrically connects the common end to a first selection end of the switch circuit during the write period, and the switch circuit electrically connects the common end to a second selection end of the switch circuit during the read period;
a data drive circuit, coupled to the first selection end of the switch circuit and used to transmit an initial voltage to the capacitor through the switch circuit, the data line, and the sensing switch during the write period; and
a read circuit, coupled to the second selection end of the switch circuit and used to read a leakage voltage of the capacitor through the switch circuit, the data line, and the sensing switch during the read period.

7. The detection device according to claim 6, wherein the read circuit judges whether the light emitting element emits light when the first voltage powers the first electrode according to a difference between the leakage voltage and the initial voltage of the capacitor.

8. The detection device according to claim 1, wherein the pixel circuit further comprises:
a reset switch, wherein a first end of the reset switch is coupled to the first end of the capacitor, a second end of the reset switch receives the common voltage, and a control end of the reset switch is coupled to a reset line.

9. The detection device according to claim 8, wherein the light sensing circuit further comprises:
a controller, coupled to the reset line and used to transmit a reset signal to the reset line to turn on the reset switch to reset a voltage of the first end of the capacitor to the common voltage during a reset period.

10. The detection device according to claim 1, wherein the light sensing circuit comprises an image capture device, a light detector, or an electrical detector.

11. A detection device, used to detect a light emitting element, the detection device comprising:
a piezoelectricity sensor, comprising a first piezoelectricity element, wherein the first piezoelectricity element is used to contact a first electrode of the light emitting element to cause a first deformation of the first piezoelectricity element, and the first piezoelectricity element generates a first voltage based on the first deformation to power the first electrode, wherein a second electrode of the light emitting element is coupled to a reference voltage; and
a light sensing circuit, used to sense whether the light emitting element powered by the first voltage emits light,
wherein the piezoelectricity sensor further comprises:
a second piezoelectricity element, used to contact the second electrode of the light emitting element to cause a second deformation of the second piezoelectricity element, wherein the second piezoelectricity element generates a second voltage based on the second deformation to power the second electrode.

12. A detection method for a light emitting element, comprising:
overlaying a piezoelectricity sensor on the light emitting element, so that a first piezoelectricity element of the piezoelectricity sensor contacts a first electrode of the light emitting element to cause a first deformation of the first piezoelectricity element, wherein a second electrode of the light emitting element is coupled to a reference voltage;
generating a first voltage based on the first deformation by the first piezoelectricity element to power the first electrode; and
sensing whether the light emitting element powered by the first voltage emits light through a light sensing circuit;
when overlaying the piezoelectricity sensor on the light emitting element, enabling a second piezoelectricity element of the piezoelectricity sensor to contact the second electrode of the light emitting element to cause a second deformation of the second piezoelectricity element; and
generating a second voltage based on the second deformation by the second piezoelectricity element to power the second electrode.

13. The detection method according to claim 12, wherein the light sensing circuit comprises an image capture device, a light detector, or an electrical detector.

* * * * *